(12) United States Patent
Torok et al.

(10) Patent No.: US 12,745,372 B2
(45) Date of Patent: Sep. 22, 2026

(54) INTRA-DRAWER HEAT EXCHANGER

(71) Applicant: International Business Machines Corporation, Armonk, NY (US)

(72) Inventors: John Torok, Poughkeepsie, NY (US); John S. Werner, Fishkill, NY (US); Dustin Demetriou, Hyde Park, NY (US); Noah Singer, White Plains, NY (US); Arkadiy O. Tsfasman, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 266 days.

(21) Appl. No.: 18/617,683

(22) Filed: Mar. 27, 2024

(65) Prior Publication Data

US 2025/0311170 A1 Oct. 2, 2025

(51) Int. Cl.
*H05K 7/20* (2006.01)
*H05K 5/02* (2006.01)

(52) U.S. Cl.
CPC ....... *H05K 7/20772* (2013.01); *H05K 5/0221* (2013.01)

(58) Field of Classification Search
CPC .. H05K 7/20; H05K 7/20136; H05K 7/20145; H05K 7/20154; H05K 7/202; H05K 7/20209; H05K 7/20218; H05K 7/20263; H05K 7/20281; H05K 7/20554–20581; H05K 7/20609; H05K 7/20627; H05K 7/20763; H05K 7/20718–20736; H05K 7/20772; H05K 7/20781; H05K 5/00; H05K 5/0213; H05K 5/0221; G06F 1/20
See application file for complete search history.

(56) References Cited

U.S. PATENT DOCUMENTS

| | | | | |
|---|---|---|---|---|
| 10,133,322 B1 * | 11/2018 | Bouve | G06F 1/20 | |
| 10,191,521 B2 * | 1/2019 | Cheng | H05K 7/20318 | |
| 11,089,715 B2 * | 8/2021 | Gao | H05K 7/20781 | |
| 11,785,741 B2 * | 10/2023 | He | H05K 7/202 | 361/702 |
| 2007/0121295 A1 * | 5/2007 | Campbell | H05K 7/20772 | 361/699 |
| 2011/0303394 A1 * | 12/2011 | Branton | H05K 7/20763 | 165/104.33 |

(Continued)

FOREIGN PATENT DOCUMENTS

| | | |
|---|---|---|
| CN | 208063645 U | 11/2018 |
| CN | 116761405 A | 9/2023 |

(Continued)

*Primary Examiner* — Amir A Jalali
(74) *Attorney, Agent, or Firm* — Gavin Giraud

(57) ABSTRACT

Embodiments disclosed herein include a server drawer. The server drawer may include a lower deck heat exchanger with an inlet, an outlet, and a fluid pump. The server drawer may also include an upper deck heat exchanger located in an upper airflow path after first heat producing elements and before a component of concern, and a manifold. The manifold may include distributors connecting i) the inlet to the upper deck heat exchanger and ii) the outlet to the upper deck heat exchanger. The fluid pump may pump cooled fluid between the upper deck heat exchanger and the lower deck heat exchange.

13 Claims, 4 Drawing Sheets

(56) References Cited

U.S. PATENT DOCUMENTS

| | | | | |
|---|---|---|---|---|
| 2014/0233179 | A1* | 8/2014 | Davis | G06F 1/206 312/236 |
| 2022/0151112 | A1 | 5/2022 | Edmunds | |
| 2022/0158265 | A1* | 5/2022 | Werner | A62C 3/16 |

FOREIGN PATENT DOCUMENTS

| | | | |
|---|---|---|---|
| KR | 102409446 | B1 | 6/2022 |
| WO | 2018012428 | A1 | 1/2018 |
| WO | 2020186859 | A1 | 9/2020 |
| WO | 2021109274 | A1 | 6/2021 |

* cited by examiner

INTRA-DRAWER HEAT EXCHANGER

BACKGROUND

The present invention relates generally to the field of drawers in server computer racks, and more particularly to heat exchangers in server drawers.

A server rack is a specialized piece of equipment for storing and organizing information technology equipment, including servers, communication devices, and network gear. These racks have standardized dimensions (typically 19 inches wide) and allow for secure mounting of hardware components. By stacking servers vertically, server racks maximize floor space utilization in data centers or server rooms. Proper airflow management may be important, and server racks facilitate this by either using natural air flows (in open racks) or employing forced ventilation systems (in enclosed cabinets). Technicians can easily access servers from all sides, simplifying installation, maintenance, and troubleshooting tasks. Drawers in server computer racks (e.g., processor drawers, input/output drawers) typically use cooling fans that flow in a single direction, with front to rear cooling being the most common path for the cooling fluid to travel.

SUMMARY

Embodiments of the present invention include an apparatus which includes a server drawer having a lower deck heat exchanger with an inlet, an outlet, and a fluid pump. The server drawer may also include an upper deck heat exchanger located in an upper airflow path after first heat producing elements and before a component of concern, and a manifold. The manifold may include distributors connecting i) the inlet to the upper deck heat exchanger and ii) the outlet to the upper deck heat exchanger. The fluid pump may pump cooled fluid between the upper deck heat exchanger and the lower deck heat exchanger.

Certain embodiment of the present invention include an inter-deck cooling system. The inter-deck cooling system may include a first heat exchanger with an inlet, an outlet, and a fluid pump configured to fit within a first deck of a server drawer. The inter-deck cooling system may also include a second heat exchanger configured to fit in a second deck of the server drawer and a manifold. The manifold may include distributors connecting i) the inlet to the second heat exchanger and ii) the outlet to the second heat exchanger. The fluid pump may pump cooled fluid to the second deck heat exchanger from the first heat exchanger.

Additional features and advantages are realized through the techniques of the present invention. Techniques of disclosed embodiments include a computer-implemented method that includes the steps of reading a condition of a component of concern within a server drawer, and engaging a fluid pump to pump a cooling fluid from a lower deck heat exchanger to an upper deck heat exchanger located in an upper airflow path after first heat producing elements and before the components of concern. The fluid pump may be engaged based on the condition relative to a threshold.

Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
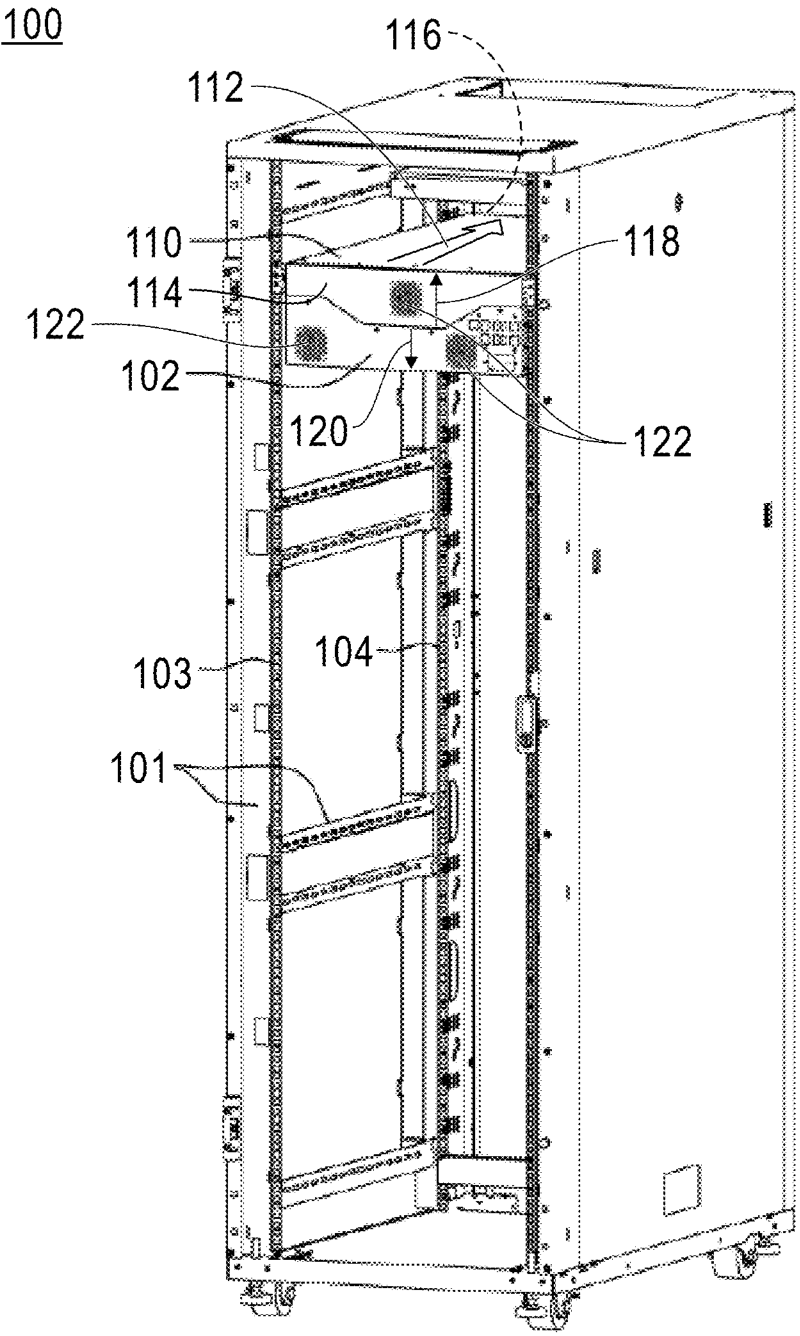
FIG. 1 depicts one embodiment of an electronics rack or frame to accommodate one or more rack-mountable server drawers, in accordance with one or more aspects of the present invention.

Aspects of the present invention and certain features, advantages and details thereof, are explained more fully below with reference to the non-limiting example(s) illustrated in the accompanying drawings. Descriptions of well-known systems, devices, fabrication techniques, etc., are omitted so as not to unnecessarily obscure the invention in detail. It should be understood, however, that the detailed description and the specific example(s), while indicating aspects of the invention, are given by way of illustration only, and not by way of limitation. Various substitutions, modifications, additions, and/or other arrangements, within the spirit and/or scope of the underlying inventive concepts will be apparent to those skilled in the art from this disclosure. Note further that numerous inventive aspects and features are disclosed herein, and unless inconsistent, each disclosed aspect or feature is combinable with any other disclosed aspect or feature as desired for a particular application of an apparatus, server rack assembly, or server drawer, such as disclosed herein. In the following detailed description, reference is made to the accompanying drawings, which show specific examples of embodiments of the invention. These embodiments are described in sufficient detail to enable those skilled in the art to practice them, and it is to be understood that other embodiments may be utilized, and that structural, logical, and electrical changes may be made without departing from the described embodiments. The following detailed description is, therefore, not to be taken in a limiting sense, and the included embodiments are defined by the appended claims.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "certain embodiments," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "above," "below," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly adjacent," "directly on," or "directly over" another element, there are no intervening elements present. It will also be understood that when an element is referred to as being "beneath" or "under" another element, it can be directly below or under the other element, or intervening elements may be present. Additionally, when an element is referred to as being "directly below" or "directly above" another element, intervening elements may be present, but the elements overlap at least partially relative to a vertical axis perpendicular to a major surface.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer-readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer-readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Circuit density of electronic devices continues to increase in order to achieve faster and faster processing speeds, there is a corresponding demand for devices to be packed more closely together, including within an electronics or computer rack, as well as within an electronic component chassis coupled to the rack. In one or more implementations, an electronic component chassis, such as a server drawer, is a frame or other internal support structure on or within which one or more circuit board assemblies and/or other electronic devices or components are mounted. Even with the additional heat described above, internal components of the server drawers may operate within expected tolerances, as improvements in processor design allows these components to operate at elevated temperatures. Cooling of external components, on the other hand, may be insufficient such that servicing the server drawers can be uncomfortable and hot to the touch. Specifically, external surfaces of the server drawer components are required to comply with touch temperature safety standards. Traditionally, an electronics rack is a metal frame structure used to hold various hardware devices, such as server, hard disk drives, modems, and other electronic equipment. While racks are provided in many different shapes and sizes, a standard-sized rack established by the Electronics Industries Association (EIA) for use with computers and other electronic equipment is typically 19-inches or 23-inches wide.

By way of example, FIG. 1 depicts one embodiment of an EIA standard-width electronics rack 100, having multiple vertical and horizontal support rails 101. For instance, electronics rack 100 includes, in one or more embodiments, front vertical mounting rails 103 and rear vertical mounting rails 104, which include respective flanges for mounting a server drawer 102, or multiple server drawers 102 to the frame of the electronics rack 100. At least one server drawer 102 can be, or have associated therewith, a rack-mountable assembly 110, such as a cover structure. In certain embodiments, the server drawer 102 and the associated cover structure are configured to form an enclosure about one or more circuit board assemblies and/or other electronic components disposed within server drawer 102. Note that for purposes of illustration only, electronics rack 100 is substantially unpopulated in FIG. 1, with the exception of server drawer 102 and rack-mountable assembly 110.

Each computer server drawer 102 may feature a cooling system that blows cooling fluid (e.g., air) in a flow direction 112 that is typically from a front 114 of the server drawer 102 to a back 116 of the server drawer 102. The server drawer 102 may also be divided into an upper deck 118 and a lower deck 120. Each of the upper deck 118 and lower deck 120 may include fans 122 that blow the cooling fluid through the space and over the heat-producing components. Furthermore, each of the upper deck 118 and lower deck 120 may include a separate size or number of fans, flow rate, and heat production within the deck, and thus may utilize different cooling capabilities. In general, however, both the upper deck 118 and lower deck 120 make use of a flow direction 112 that is continuous in that direction (i.e., from front to back, or back to front). This cooling in a single direction can lead to problems such as overheating of components in the back 116 that are "cooled" with air that has already been heated by the heat-producing components in the front 112. This heated cooling air does not cool the rear components as well as non-heated, room-temperature cooling fluid, and thus the rear components cannot dissipate as much heat to the cooling fluid, which may contribute to efficiency and longevity problems over the life of the rear components. Furthermore, during a service operation, external touchable components may be hotter than safety regulations will allow.

To address this concern, the server drawer 102, may include a cooling system with a lower deck heat exchanger and an upper deck heat exchanger with a manifold between them to facilitate focused cooling on a component of concern based on cooling needs within the server drawer 102. The cooling needs may be based on longevity concerns of an internal component of concern, such that specific locations of the upper deck 118 and/or lower deck 120 may be prioritized by pumping a cooling fluid within the manifold. External components of interest may also be prioritized, such as during a service call, by pulling heat through the heat exchangers away from the external component of concern.

Figure 2:
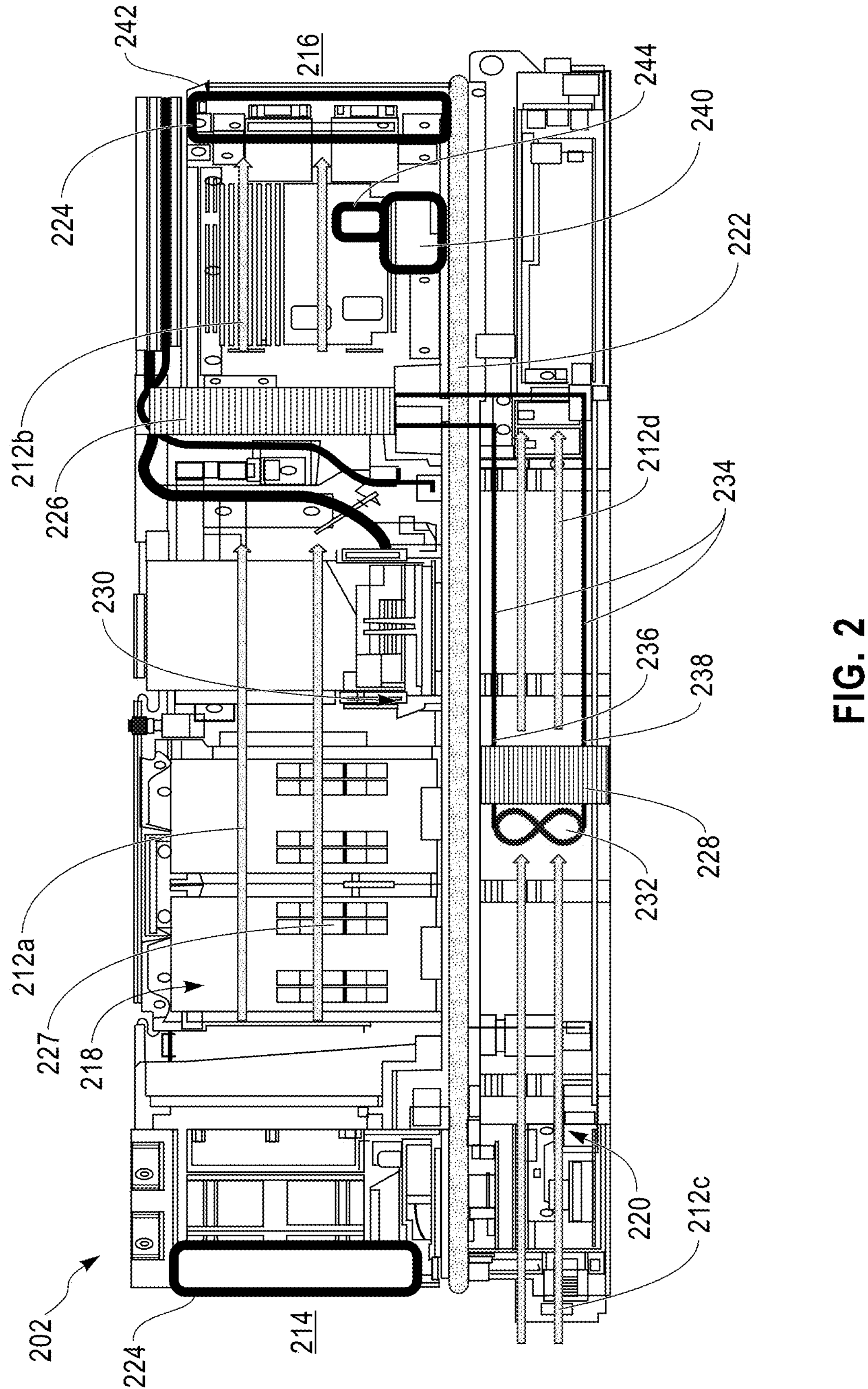
FIG. 2 depicts a server drawer for use in an electronics rack, with a cooling system in accordance with one embodiment of the present invention.

To more particularly illustrate the method and system in accordance with the present invention, refer now to FIG. 2, depicting a cross-sectional side view of one embodiment of a server drawer 202 in accordance with one embodiment of the present invention. The server drawer 202 includes an upper deck 218 and a lower deck 220 that are separated by a deck divider 222. The upper deck 218 has an upper deck airflow 212*a, b* that flows from a front 214 of the server drawer 202 to a back 216. The upper deck airflow 224 may be facilitated by upper deck fans 224. In the illustrated embodiment, the server drawer 202 has upper deck fans 224 in the front 214 and the back 216, but certain embodiments may have only one fan 224, or fans 224 only on one side (i.e., either the front 214 or the back 216). The upper deck airflow 212*a, b* is divided into a fore upper deck airflow 212*a* and an aft upper deck airflow 212*b* by an upper deck heat exchanger 226. The upper deck heat exchanger 226 is placed in the upper deck airflow 212*a, b* after first heat producing elements 227.

The lower deck 220 of the server drawer 202 also includes a fore lower deck airflow 212*c* and an aft lower deck airflow 212*d* that are divided by a lower deck heat exchanger 228. The upper deck heat exchanger 226 and the lower deck heat exchanger 228 form an inter-deck cooling system 230 that may include other components to facilitate the mid-airflow heat exchange within the server drawer 202. For example, the cooling system 230 may include a fluid pump 232 and distributors 234 that pump a fluid (e.g., water, liquid coolant) through the upper deck heat exchanger 226 and the lower deck heat exchanger 228. The distributors 234 may include rigid pipes securely mounted to the walls of the server drawer 202, or may include flexible tubing running in a more elastic path around the components within the server drawer 202.

The fluid pump 232 pumps coolant through the lower deck heat exchanger 228, which is located toward the front 214 (early part of the airflow 212) so that the coolant cools down. The lower deck heat exchanger 228 may be directly behind of or in front of lower deck fans, or may be behind some of heat producing elements 227 in the lower deck 220. The lower fore airflow 212*c* is generally cooler than the upper fore airflow 212*a* because there are less heat producing elements 227 in the lower airflow 212*c, d*. Then the fluid pump 232 pumps the coolant through an outlet 236 to the upper deck heat exchanger 226. The coolant cools the upper deck heat exchanger 226, pulling heat from the upper deck heat exchanger 226 into the coolant. The warmed coolant then returns to the lower deck heat exchanger 228 through a inlet 238. The aft lower deck airflow 212*d* is thus slightly warmer relative to the fore lower deck airflow 212*c*, but the aft upper deck airflow 212*b* is cooler than the fore upper deck airflow 212*a*. This cooler airflow provides better cooling for an internal component of concern 240 or an external component of concern 242. The inter-deck cooling system 230 may also include a sensor 244 that measures a condition of the internal component of concern 240 or the external component of concern 242.

Internal components of interest 240 may include input/output (IO) cards, solid state drives (SSDs), power supplies, optics transceivers, cables, processors, memory dual in-line memory modules (DIMMs), (voltage regulator modules) VRMs, (printed circuit boards) PCBs, electrical components (resistors, capacitors, integrated circuits (ICs), etc.), or other internal components that may benefit from extra cooling provided by the inter-deck cooling system 230. External components of interest 242 may include external touch surfaces such as screws, panels, bolts, connectors, etc. that are handled during a service operation. The external components of interest 242 may also include locks configured to prevent opening of the server drawer 202 when temperature sensors indicate the current temperature exceeds a temperature threshold.

Figure 3:
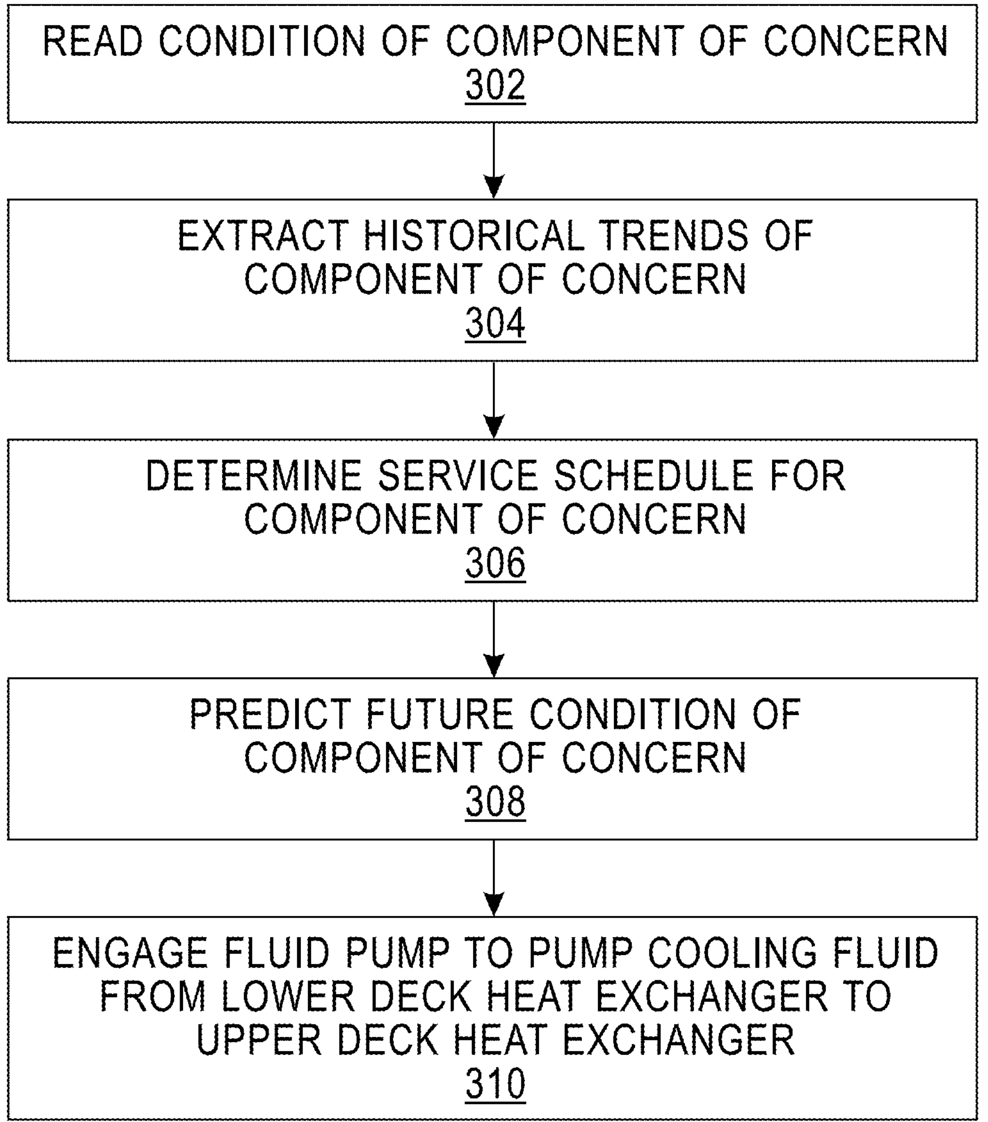
FIG. 3 depicts a flowchart of a method of operating a cooling system in a server drawer, in accordance with one embodiment of the present invention.

FIG. 3 depicts a flowchart of a method 300 of operation of an inter-deck cooling system, in accordance with one embodiment of the present invention. For example, a processor or set of processors integrated into the inter-deck cooling system 230 may perform the method 300 within the server drawer 202. At stage 302, the cooling system 230 reads a condition of a component of concern. The component of concern may be one of the internal components of concern 240 or one of the external components of concern 242. A sensor, such as the sensor 244 shown in FIG. 2, may be used to determine the condition of the component of concern. The cooling system primarily reads a temperature of the component of concern, but other types of sensors may detect other conditions as well, and the embodiments disclosed herein should not be limited as only reading a one type of condition. Furthermore, other factors such as utilization of a component can be used to infer that additional cooling is required. For example, if a hard drive has been fully utilized for a certain amount of time, then a surrounding metal chassis of the hard drive may be inferred to be hot even if no sensors directly measure the current actual temperature of the hard drive.

The cooling system 230, at stage 304, may also extract historical trends of the component of concern. Historical trends may include individualized trends focused on one specific component of concern. For example, a processor or IO card may have a historical trend indicating have heavier utilization during the day, as compared with much lighter utilization at night. Moreover, historical trends may indicate heavier usage of the component of concern during weekdays compared with the lighter usage on weekends. Memory backup, as one instance of scheduled utilization, is typically done once per week so solid state drives (SSDs) may be hotter during that weekly window of time. Additionally, historical trends may indicate that certain components of concern may be utilized more heavily at certain times of the year (e.g., more transactions during the holiday season than at other times during the year.

Furthermore, the cooling system may extract the historical service procedures that have been performed on the component of concern, the time frame that this specific component of concern has been in operation, and the usage (e.g., temperatures) over time that the component of concern has experienced. Historical trends may also include information about the breakdown or servicing of similar components in other server drawers 202 and the endurance/longevity of those components.

From the historical trends, the cooling system 230, at stage 306, may determine a service schedule for the component of concern. The service schedule may include cooling needs, and the time periods in which service from a service operator may be required. The service schedule may include, for example, a time window in which a service visit to the server drawer 202 may occur. An operator may also input a service schedule for when service operations may be conducted. The service schedule may also include service operations that are dependent upon certain detected conditions of the component of concern. For example, a service operation may be conducted based on a temperature reading over a threshold for a certain period of time.

The cooling system 230, at stage 308, may predict a future condition of the component of concern. The future condition may be based on the condition read by the cooling system and an expected power load of the first heat producing elements determined from the historical trends. The cooling system may also calculate the required cooling capacity between the lower deck 220 and the upper deck 218 to be provided by the cooling system 230. The required cooling capacity may include the capacity to keep the component of concern at a certain temperature, for example. Furthermore, the future condition may depend on the service schedule for the component of concern. For example, when a service operation is imminent, the future condition may include a requirement to cool the external component(s) of concern 242 to bring the temperature in line with safety requirements for servicing the server drawer 202. The future condition may also depend on and an expected power load of the heat producing elements within the server drawer 202, as determined from the historical trends. For example, if the historical trends indicate that an increase in processing (and the accompanying increase in heat production) will occur in the next hour, the cooling system 230 may calculate an increased required cooling capacity between the lower deck 220 and the upper deck 218.

The cooling system 230, at stage 310, may engage the fluid pump 232 to pump a cooling fluid from the lower deck heat exchanger 228 to the upper deck heat exchanger 226 located in the upper airflow path 212*a, b* after first heat producing elements 227 and before the component of concern 240, 242. The fluid pump 232 may be engaged based on the condition relative to a threshold.

In certain embodiments, the server drawer 202 may have more heat producing elements 227 in the lower deck 220 such that both the lower deck 220 and upper deck 218 both have heat producing elements 227. In such embodiments, the cooling system 230 may control the heat transfer such that components of concern 240, 242 after the lower deck heat exchanger 228 are being cooled with air from the upper deck (i.e., the fluid pump 232 pumps fluid that is cooled by the upper deck heat exchanger 226 to cool the air passing over the lower deck heat exchanger 228).

Selecting between cooling components of concern 240, 242 in the upper deck 218 and lower deck 220 could help with longevity of all parts within the server drawer 202 rather than the components of concern 240, 242 in just one of the decks 218, 220. Providing cooling based on whether the upper deck 218 or lower deck 220 is scheduled to receive service can also be accomplished in this embodiments (e.g., if a power supply unit in the lower deck 220 needs servicing, it may be possible to cool the power supply unit using air from the upper deck 218).

Computing environment 400 contains an example of an environment for the execution of at least some of the computer code involved in performing the inventive methods, such the inter-deck cooling system method 300. In addition to block 200, computing environment 400 includes, for example, computer 401, wide area network (WAN) 402, end user device (EUD) 403, remote server 404, public cloud 405, and private cloud 406. In this embodiment, computer 401 includes processor set 410 (including processing circuitry 120 and cache 421), communication fabric 411, volatile memory 412, persistent storage 413 (including operating system 422 and block 300, as identified above), peripheral device set 414 (including user interface (UI) device set 423, storage 424, and Internet of Things (IoT) sensor set 425), and network module 415. Remote server 404 includes remote database 430. Public cloud 405 includes gateway 440, cloud orchestration module 441, host physical machine set 442, virtual machine set 443, and container set 444.

Figure 4:
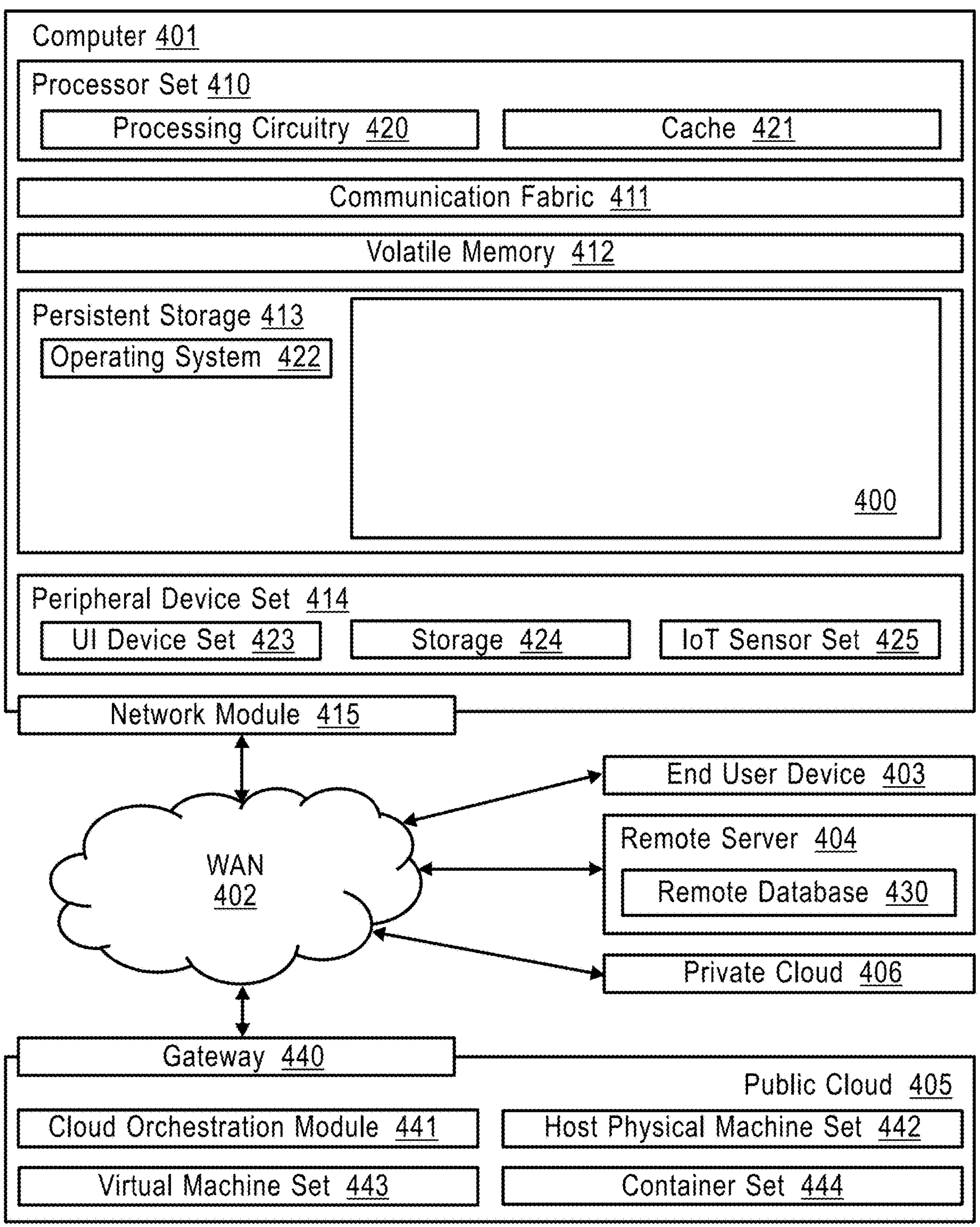
FIG. 4 depicts a computing environment for the execution of at least some of the computer code involved in performing methods in accordance with one embodiment of the present invention.

COMPUTER 401 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 430. As is well understood in the art of computer technology, and depending upon the technology, performance of a computer-implemented method may be distributed among multiple computers and/or between multiple locations. On the other hand, in this presentation of computing environment 400, detailed discussion is focused on a single computer, specifically computer 401, to keep the presentation as simple as possible. Computer 401 may be located in a cloud, even though it is not shown in a cloud in FIG. 4. On the other hand, computer 401 is not required to be in a cloud except to any extent as may be affirmatively indicated.

PROCESSOR SET 410 includes one, or more, computer processors of any type now known or to be developed in the future. Processing circuitry 420 may be distributed over multiple packages, for example, multiple, coordinated integrated circuit chips. Processing circuitry 420 may implement multiple processor threads and/or multiple processor cores. Cache 421 is memory that is located in the processor chip package(s) and is typically used for data or code that should be available for rapid access by the threads or cores running on processor set 410. Cache memories are typically organized into multiple levels depending upon relative proximity to the processing circuitry. Alternatively, some, or all, of the cache for the processor set may be located "off chip." In some computing environments, processor set 410 may be designed for working with qubits and performing quantum computing.

Computer-readable program instructions are typically loaded onto computer 401 to cause a series of operational steps to be performed by processor set 410 of computer 401 and thereby effect a computer-implemented method, such that the instructions thus executed will instantiate the methods specified in flowcharts and/or narrative descriptions of computer-implemented methods included in this document (collectively referred to as "the inventive methods"). These computer-readable program instructions are stored in various types of computer-readable storage media, such as cache 421 and the other storage media discussed below. The program instructions, and associated data, are accessed by processor set 410 to control and direct performance of the inventive methods. In computing environment 400, at least some of the instructions for performing the inventive methods may be stored in block 200 in persistent storage 413.

COMMUNICATION FABRIC 411 is the signal conduction path that allows the various components of computer 401 to communicate with each other. Typically, this fabric is made of switches and electrically conductive paths, such as the switches and electrically conductive paths that make up buses, bridges, physical input/output ports and the like. Other types of signal communication paths may be used, such as fiber optic communication paths and/or wireless communication paths.

VOLATILE MEMORY 412 is any type of volatile memory now known or to be developed in the future. Examples include dynamic type random access memory (RAM) or static type RAM. Typically, volatile memory 412 is characterized by random access, but this is not required unless affirmatively indicated. In computer 401, the volatile memory 412 is located in a single package and is internal to computer 401, but, alternatively or additionally, the volatile memory may be distributed over multiple packages and/or located externally with respect to computer 401.

PERSISTENT STORAGE 413 is any form of non-volatile storage for computers that is now known or to be developed in the future. The non-volatility of this storage means that the stored data is maintained regardless of whether power is being supplied to computer 401 and/or directly to persistent storage 413. Persistent storage 413 may be a read only memory (ROM), but typically at least a portion of the persistent storage allows writing of data, deletion of data and re-writing of data. Some familiar forms of persistent storage include magnetic disks and solid state storage devices. Operating system 422 may take several forms, such as various known proprietary operating systems or open source Portable Operating System Interface-type operating systems that employ a kernel. The code included in block 200 typically includes at least some of the computer code involved in performing the inventive methods.

PERIPHERAL DEVICE SET 414 includes the set of peripheral devices of computer 401. Data communication connections between the peripheral devices and the other components of computer 401 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 423 may include components such as a display screen, speaker, microphone, wearable devices (such as goggles and smart watches), keyboard, mouse, printer, touchpad, game controllers, and haptic devices. Storage 424 is external storage, such as an external hard drive, or insertable storage, such as an SD card. Storage 424 may be persistent and/or volatile. In some embodiments, storage 424 may take the form of a quantum computing storage device for storing data in the form of qubits. In embodiments where computer 401 is required to have a large amount of storage (for example, where computer 401 locally stores and manages a large database) then this storage may be provided by peripheral storage devices designed for storing very large amounts of data, such as a storage area network (SAN) that is shared by multiple, geographically distributed computers. IoT sensor set 425 is made up of sensors that can be used in Internet of Things applications. For example, one sensor may be a thermometer and another sensor may be a motion detector.

NETWORK MODULE 415 is the collection of computer software, hardware, and firmware that allows computer 401 to communicate with other computers through WAN 402. Network module 415 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 415 are performed on the same physical hardware device. In other embodiments (for example, embodiments that utilize software-defined networking (SDN)), the control functions and the forwarding functions of network module 415 are performed on physically separate devices, such that the control functions manage several different network hardware devices. Computer-readable program instructions for performing the inventive methods can typically be downloaded to computer 401 from an external computer or external storage device through a network adapter card or network interface included in network module 415.

WAN 402 is any wide area network (for example, the internet) capable of communicating computer data over non-local distances by any technology for communicating computer data, now known or to be developed in the future. In some embodiments, the WAN 402 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 403 is any computer system that is used and controlled by an end user (for example, a customer of an enterprise that operates computer 401), and may take any of the forms discussed above in connection with computer 401. EUD 403 typically receives helpful and useful data from the operations of computer 401. For example, in a hypothetical case where computer 401 is designed to provide a recommendation to an end user, this recommendation would typically be communicated from network module 415 of computer 401 through WAN 402 to EUD 403. In this way, EUD 403 can display, or otherwise present, the recommendation to an end user. In some embodiments, EUD 403 may be a client device, such as thin client, heavy client, mainframe computer, desktop computer and so on.

REMOTE SERVER 404 is any computer system that serves at least some data and/or functionality to computer 401. Remote server 404 may be controlled and used by the same entity that operates computer 401. Remote server 404 represents the machine(s) that collect and store helpful and useful data for use by other computers, such as computer 401. For example, in a hypothetical case where computer 401 is designed and programmed to provide a recommendation based on historical data, then this historical data may be provided to computer 401 from remote database 430 of remote server 404.

PUBLIC CLOUD 405 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 405 is performed by the computer hardware and/or software of cloud orchestration module 441. The computing resources provided by public cloud 405 are typically implemented by virtual computing environments that run on various computers making up the computers of host physical machine set 442, which is the universe of physical computers in and/or available to public cloud 405. The virtual computing environments (VCEs) typically take the form of virtual machines from virtual machine set 443 and/or containers from container set 444. It is understood that these VCEs may be stored as images and may be transferred among and between the various physical machine hosts, either as images or after instantiation of the VCE. Cloud orchestration module 441 manages the transfer and storage of images, deploys new instantiations of VCEs and manages active instantiations of VCE deployments. Gateway 440 is the collection of computer software, hardware, and firmware that allows public cloud 405 to communicate through WAN 402.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 406 is similar to public cloud 405, except that the computing resources are only available for use by a single enterprise. While private cloud 406 is depicted as being in communication with WAN 402, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 405 and private cloud 406 are both part of a larger hybrid cloud.

CLOUD COMPUTING SERVICES AND/OR MICRO-SERVICES (not separately shown in FIG. 4): private and public clouds 406 are programmed and configured to deliver cloud computing services and/or microservices (unless otherwise indicated, the word "microservices" shall be interpreted as inclusive of larger "services" regardless of size). Cloud services are infrastructure, platforms, or software that are typically hosted by third-party providers and made available to users through the internet. Cloud services facilitate the flow of user data from front-end clients (for example, user-side servers, tablets, desktops, laptops), through the internet, to the provider's systems, and back. In some embodiments, cloud services may be configured and orchestrated according to as "as a service" technology paradigm where something is being presented to an internal or external customer in the form of a cloud computing service. As-a-Service offerings typically provide endpoints with which various customers interface. These endpoints are typically based on a set of APIs. One category of as-a-service offering is Platform as a Service (PaaS), where a service provider provisions, instantiates, runs, and manages a modular bundle of code that customers can use to instantiate a computing platform and one or more applications, without the complexity of building and maintaining the infrastructure typically associated with these things. Another category is Software as a Service (SaaS) where software is centrally hosted and allocated on a subscription basis. SaaS is also known as on-demand software, web-based software, or web-hosted software. Four technological sub-fields involved in cloud services are: deployment, integration, on demand, and virtual private networks.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A server drawer, comprising:

a lower deck heat exchanger comprising an inlet, an outlet, and a fluid pump;

an upper deck heat exchanger located in an upper airflow path after first heat producing elements and before a component of concern that comprises an electrical component;

a manifold comprising distributors connecting I) the inlet to the upper deck heat exchanger and ii) the outlet to the upper deck heat exchanger, wherein the fluid pump pumps cooled fluid between the upper deck heat exchanger and the lower deck heat exchanger.

2. The server drawer of claim 1, further comprising an upper deck fan configured to move air across the upper deck heat exchanger.

3. The server drawer of claim 1, further comprising a lower deck fan configured to move air across the lower deck heat exchanger.

4. The server drawer of claim 1, further comprising a lower deck fan configured to push air across the lower deck heat exchanger.

5. The server drawer of claim 1, wherein the electrical component comprise a selection from the group consisting of: input/output (IO) cards, solid state drives (SSDs), power supplies, optics transceivers, cables, connectors, and external touch surfaces.

6. The server drawer of claim 1, further comprising a temperature sensor configured to gather current temperature data from the component of concern.

7. The server drawer of claim 6, further comprising a lock configured to prevent opening of the server drawer when the temperature sensors indicate the current temperature exceeds a temperature threshold.

8. An inter-deck cooling system, comprising:

a first heat exchanger comprising an inlet, an outlet, and a fluid pump configured to fit within a first deck of a server drawer;

a second heat exchanger configured to fit in a second deck of the server drawer; and a manifold comprising distributors connecting i) the inlet to the second heat exchanger and ii) the outlet to the second heat exchanger, wherein the fluid pump pumps cooled fluid to the second deck heat exchanger from the first heat exchanger.

9. The cooling system of claim 8, further comprising a first deck fan configured to move air across the first deck heat exchanger.

10. The cooling system of claim 8, further comprising a second deck fan configured to move air across the second deck heat exchanger.

11. The cooling system of claim 8, further comprising a temperature sensor configured to gather current temperature data from component of concern that comprises an electrical component within the server drawer.

12. The cooling system of claim 11, wherein the electrical component comprise a selection from the group consisting of: IO cards, SSDs, power supplies, optics transceivers, cables, connectors, and external touch surfaces.

13. The cooling system of claim 8, further comprising locks configured to prevent opening of the server drawer when the temperature sensors indicate the current temperature exceeds a temperature threshold.

* * * * *